(12) United States Patent
Jin

(10) Patent No.: US 10,840,643 B1
(45) Date of Patent: Nov. 17, 2020

(54) LATERAL ELECTRICAL CONNECTOR

(71) Applicant: Facebook, Inc., Menlo Park, CA (US)

(72) Inventor: Tiffany Jin, San Mateo, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/537,208

(22) Filed: Aug. 9, 2019

(51) Int. Cl.
*H01R 13/631* (2006.01)
*H01R 12/72* (2011.01)
*H05K 7/14* (2006.01)

(52) U.S. Cl.
CPC ....... *H01R 13/6315* (2013.01); *H01R 12/722* (2013.01); *H05K 7/1487* (2013.01); *H05K 7/1489* (2013.01)

(58) Field of Classification Search
CPC ............ H01R 13/6315; H01R 12/272; H01R 7/1487; H01R 7/1489
USPC ......................................................... 439/247
See application file for complete search history.

(56) References Cited

U.S. PATENT DOCUMENTS

| | | | | |
|---|---|---|---|---|
| 5,695,351 A * | 12/1997 | Kimura | ................ | H01R 13/633 439/159 |
| 5,980,322 A * | 11/1999 | Madsen | ................ | H01R 13/68 439/620.26 |
| 6,010,344 A * | 1/2000 | Muramatsu | ............ | G06K 13/08 439/159 |
| 6,116,927 A * | 9/2000 | Johnson | ................ | H01R 24/62 439/131 |
| 6,381,146 B1 * | 4/2002 | Sevier | .................. | H05K 7/1409 200/51 R |
| 6,424,781 B1 * | 7/2002 | Puetz | .................... | H04Q 1/068 385/135 |
| 6,930,892 B2 * | 8/2005 | Barringer | ............. | H05K 5/0295 361/726 |
| 7,145,780 B2 * | 12/2006 | Malone | ................ | H05K 7/1421 361/752 |
| 7,215,556 B2 * | 5/2007 | Wrycraft | ............. | H05K 7/1409 361/741 |
| 7,265,968 B2 * | 9/2007 | Champion | ............. | G06F 1/185 361/679.01 |
| 7,297,015 B1 * | 11/2007 | Desrosiers | ........... | H05K 7/1402 361/755 |
| 7,364,447 B1 * | 4/2008 | Desrosiers | .............. | G06F 1/186 439/157 |
| 7,466,561 B2 * | 12/2008 | Dean | ....................... | G06F 1/184 361/754 |
| 7,916,476 B2 * | 3/2011 | Hsu | ........................ | G06F 1/186 211/41.17 |
| 7,952,883 B2 * | 5/2011 | Hidaka | .................... | H05K 7/16 312/223.1 |
| 8,649,182 B2 * | 2/2014 | Ko | ........................ | G06F 1/1633 361/755 |
| 8,760,881 B2 * | 6/2014 | Saito | .................... | H05K 7/1461 361/679.01 |
| 9,166,332 B2 * | 10/2015 | Matoba | .............. | H01R 13/6275 |

(Continued)

*Primary Examiner* — Alexander Gilman
(74) *Attorney, Agent, or Firm* — Van Pelt, Yi & James LLP

(57) ABSTRACT

A chassis is configured to receive a movable component inserted in the chassis. A lever arm is housed at least in part within the chassis and configured to rotate about a pivot point from a force applied on the lever arm by a contact portion of the movable component inserted in the chassis. At least a portion of an electrical connector is coupled to the lever arm and configured to rotate and mate with a mating portion located on a lateral side of the moveable component.

24 Claims, 14 Drawing Sheets

(56) References Cited

U.S. PATENT DOCUMENTS

| | | | | |
|---|---|---|---|---|
| 9,184,536 B2* | 11/2015 | Senatori | ................ | G06F 1/1656 |
| 9,214,749 B2* | 12/2015 | Li | ................... | H01R 13/62944 |
| 9,261,899 B2* | 2/2016 | Fujiwara | ................... | G06F 1/16 |
| 9,509,073 B2* | 11/2016 | Hsu | ................... | H01R 12/7076 |
| 9,590,335 B1* | 3/2017 | Ashibu | ................. | H01R 12/88 |
| 9,692,158 B1* | 6/2017 | Vinther | ............. | H01R 13/6275 |
| 9,698,509 B2* | 7/2017 | Ashibu | ................ | H01R 12/774 |
| 10,188,012 B2* | 1/2019 | Leigh | ....................... | H04Q 1/06 |
| 10,283,908 B1* | 5/2019 | Simmons | ............. | H01R 13/635 |
| 10,594,078 B2* | 3/2020 | Leigh | ..................... | G02B 6/389 |
| 2003/0222034 A1* | 12/2003 | Champion | ........... | H05K 7/1491 |
| | | | | 211/26 |
| 2012/0099284 A1* | 4/2012 | Boetzer | ................ | H05K 7/1409 |
| | | | | 361/754 |
| 2012/0268137 A1* | 10/2012 | Takamori | ............... | H01R 12/62 |
| | | | | 324/538 |
| 2013/0196523 A1* | 8/2013 | Lim | .................... | G06K 7/0021 |
| | | | | 439/153 |
| 2013/0280947 A1* | 10/2013 | Matoba | .................. | H01R 13/62 |
| | | | | 439/372 |
| 2014/0119704 A1* | 5/2014 | Ciechomski | ......... | G02B 6/4452 |
| | | | | 385/135 |
| 2016/0124470 A1* | 5/2016 | Leigh | ........................ | G06F 1/18 |
| | | | | 361/679.58 |

\* cited by examiner

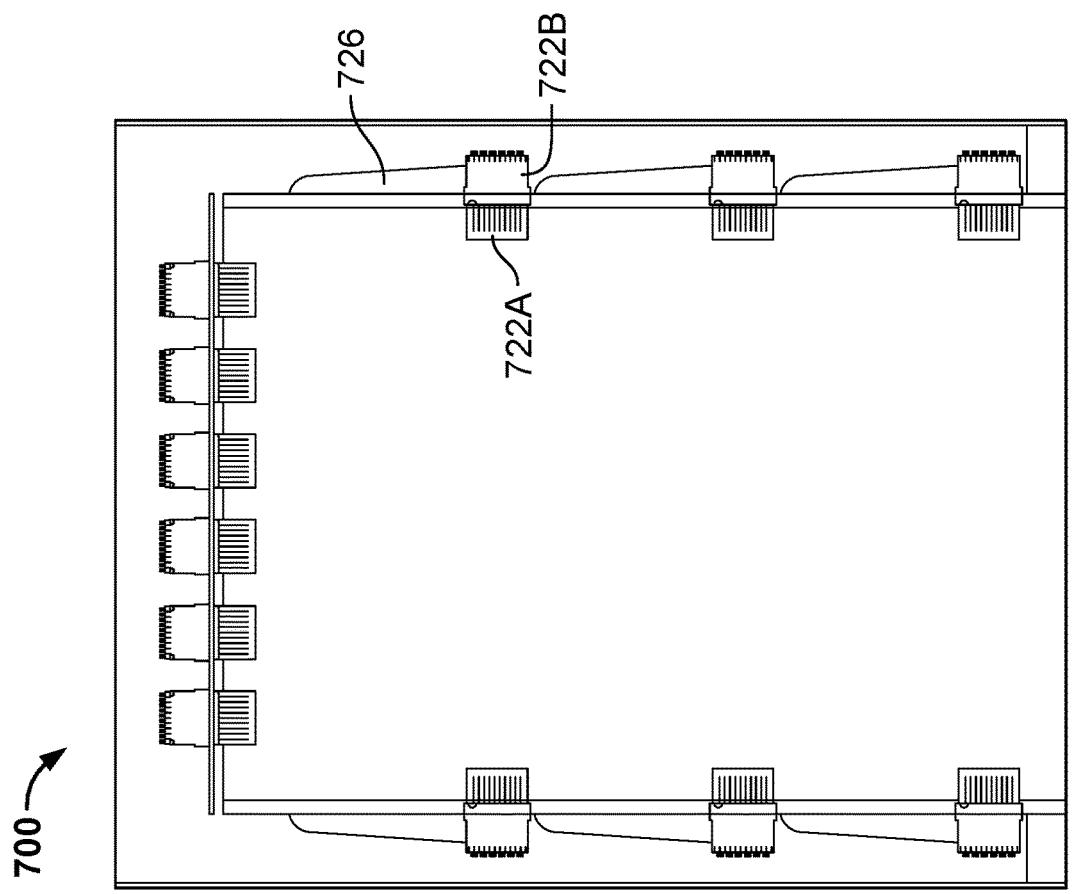
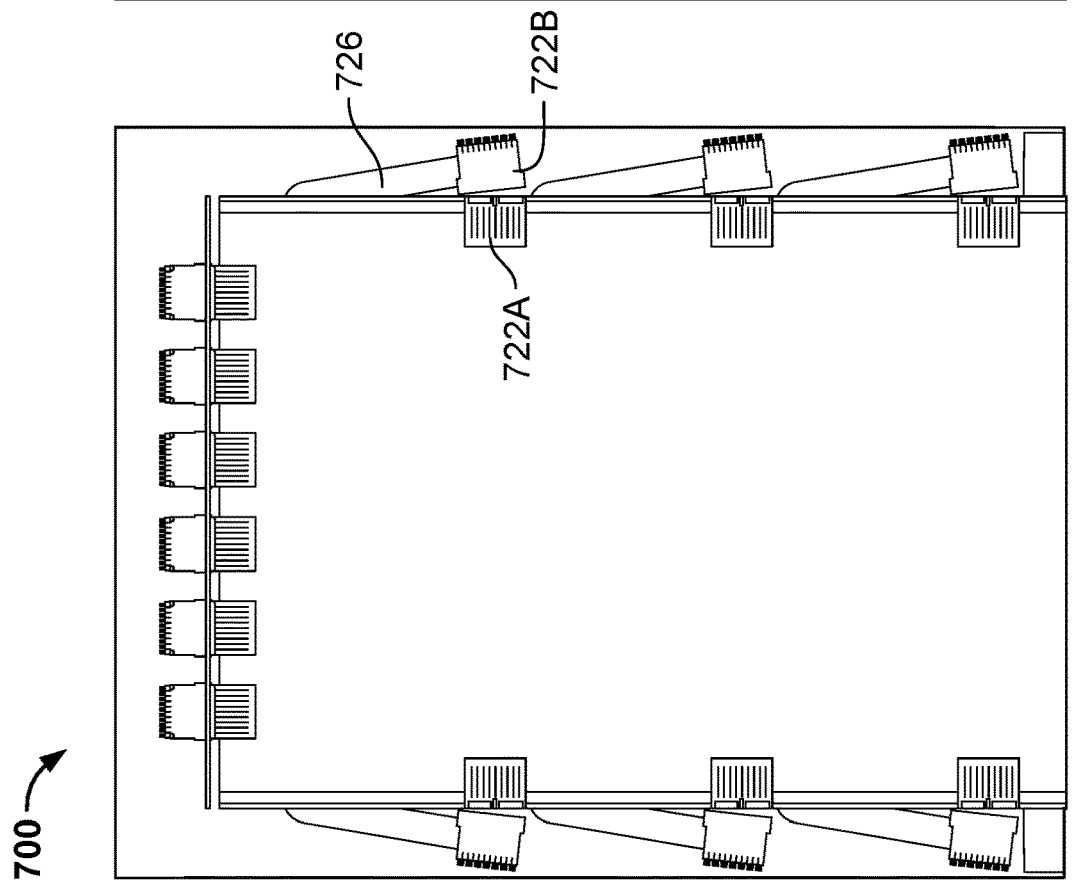

LATERAL ELECTRICAL CONNECTOR

BACKGROUND OF THE INVENTION

A server chassis (also referred to as a computer chassis or computer rack) is a metal structure that is used to house or physically assemble different electronic devices, such as servers or other storage and peripheral devices. In a serviceable front-loading server system, printed circuit boards (PCBs) with different electronic devices may be installed in the server chassis from the front side of the server system. For example, when a printed circuit board is installed in the front-loading server system, the printed circuit board is pushed into the server chassis and connected to other parts of the server system using electrical connectors, such as blind mate connectors. A blind mate connector has a mating action that happens via a sliding or snapping action, which can be accomplished without a tool, such as a wrench. A blind mate connector has self-aligning features that allow for small misalignments when mating.

BRIEF DESCRIPTION OF THE DRAWINGS

Various embodiments of the invention are disclosed in the following detailed description and the accompanying drawings.

FIG. 7C illustrates that when the lever arm 726 is not fully rotated, the two portions (male pins portion and the female receptacles portion) of an electrical connector (722A and 722B) are not connected or mated at the lateral side of system 700.

FIG. 7D illustrates that when the lever arm 726 is fully rotated, the two portions (the male pins portion and the female receptacles portion) of an electrical connector (722A and 722B) are connected or mated at the lateral side of system 700.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
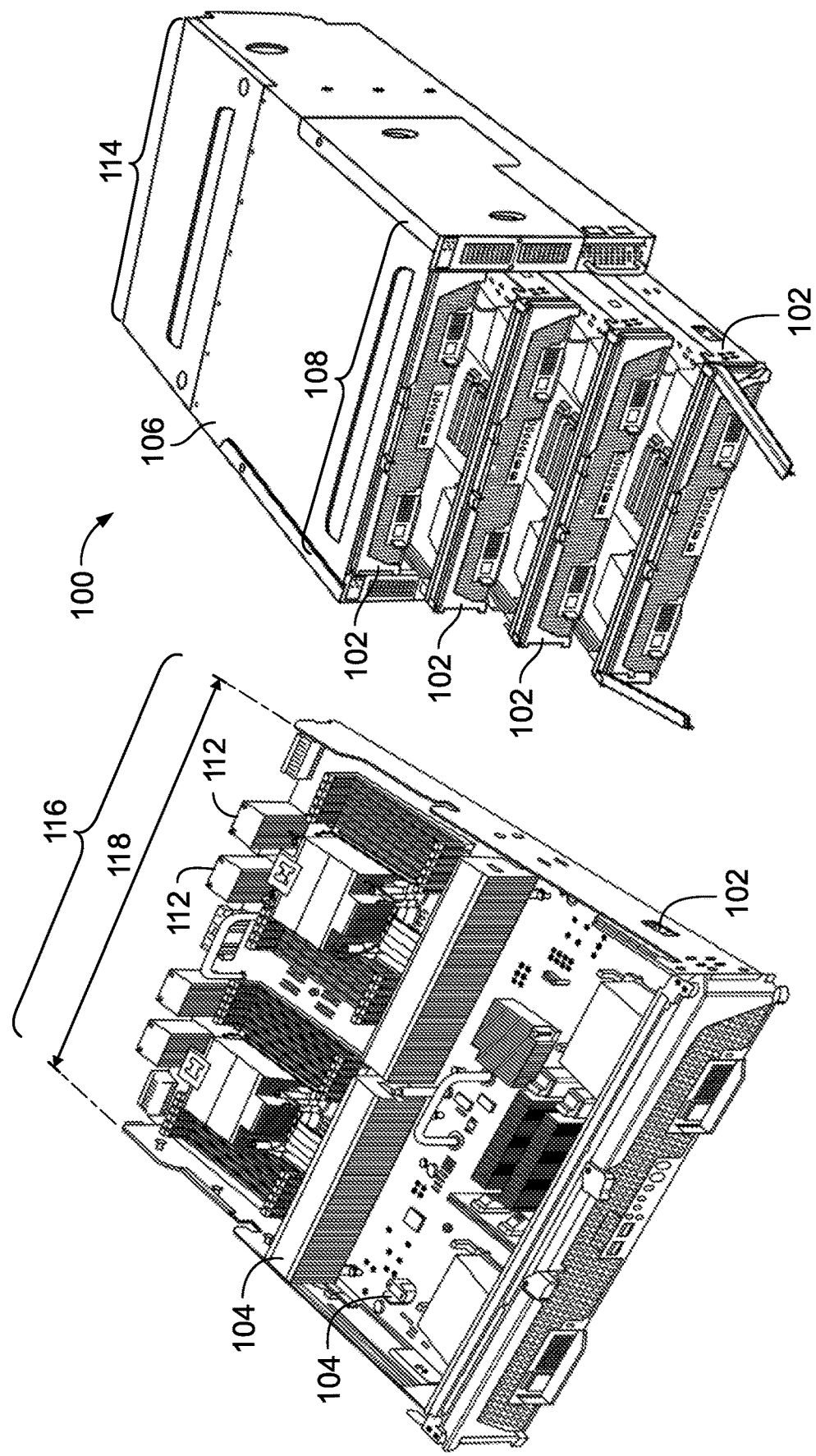
FIG. 1 illustrates an example of a serviceable front-loading server system 100.

FIG. 1 illustrates an example of a serviceable front-loading server system 100. A plurality of printed circuit boards (PCBs) 102 with different electronic devices 104 may be installed in a server chassis 106 from the front side 108 of the server system 100. For example, when a printed circuit board 102 is installed in the front-loading server system 100, the printed circuit board 102 is pushed in an installing direction 110 into server chassis 106 and is connected to other parts of the server system 100 (e.g., other PCBs of the system) using electrical connectors 112 that are located at the rear side 114 of system 100. For example, the electrical connectors 112 may be blind mate connectors. A blind mate connector has a mating action that happens via a sliding or snapping action, which can be accomplished without a tool, such as a wrench. A blind mate connector has self-aligning features that allows for small misalignments when mating.

Each of the PCBs 102 in server system 100 requires many connections to other parts of the system and therefore requires many blind mate connectors 112 to provide all the necessary pins for the connections. Since the male pins and the female receptacles of a blind mate connector 112 are typically located at the rear side 116 of the PCB 102 and the rear side 114 of server chassis 106, the number of blind mate connectors 112 that can be placed on the PCB 102 is limited by the width 118 of the rear side 116 of the PCB 102.

One technique to increase the pins available on a PCB 102 in server system 100 is to place larger blind mate connectors 112 on the rear side 116 of the PCB 102. However, larger blind mate connectors 112 have a number of drawbacks. First, a larger blind mate connector 112 has signal integrity issues: the increased height and size of a larger blind mate connector 112 may introduce more noise to the server system 100 and therefore may significantly affect the signal-to-noise ratio of the system. Second, a larger blind mate connector 112 may block the airflow provided by the fans that are typically located at the rear side 114 of server chassis 106, thereby causing server system 100 to overheat.

Figure 2:
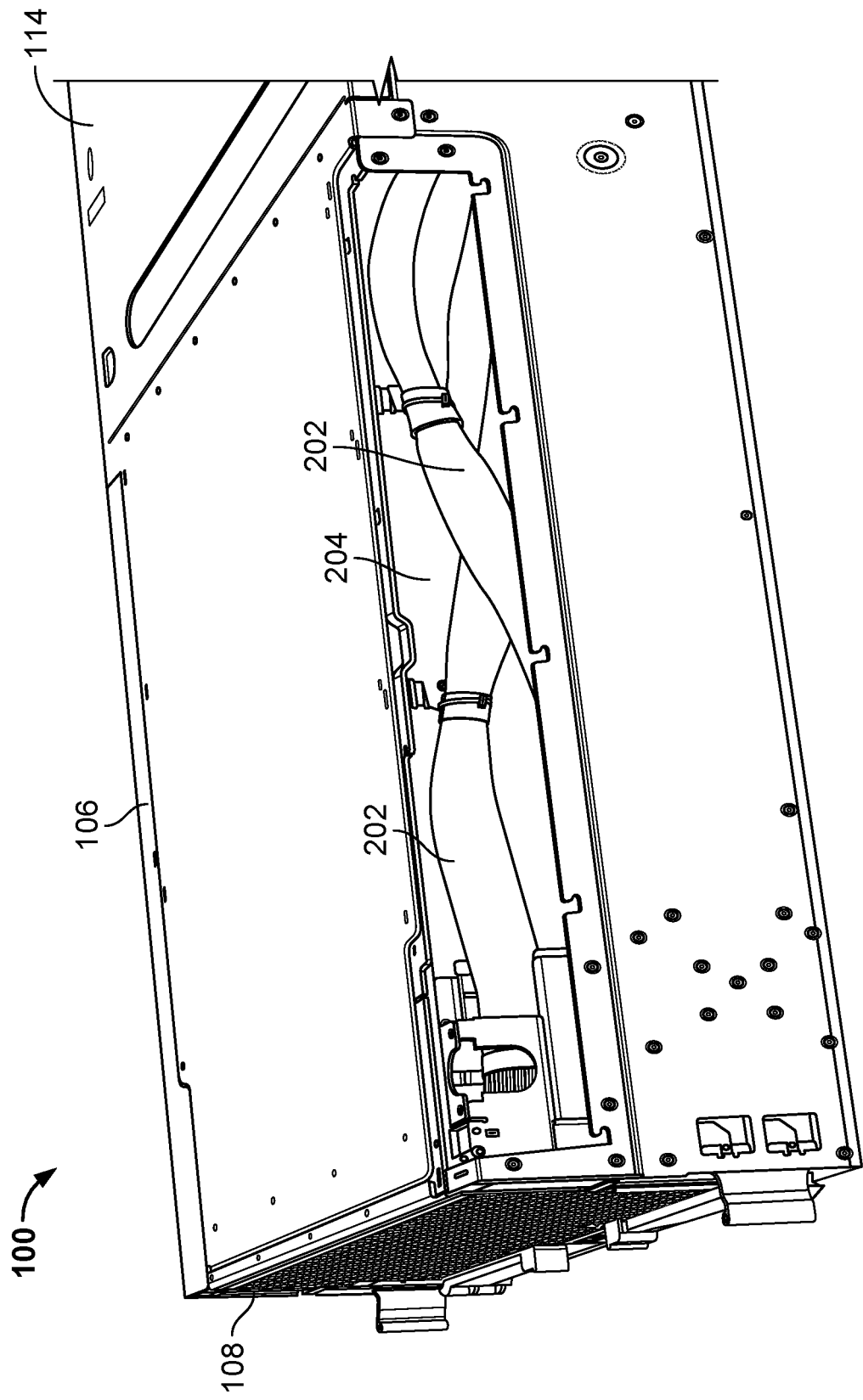
FIG. 2 illustrates that long cables are needed to route the signals from the pins of the blind mate connectors to the front of the server system.

FIG. 2 illustrates that long cables are needed to route the signals from the pins of the blind mate connectors to the front of the server system. As shown in FIG. 2, the signals from the pins of the blind mate connectors (not shown in the figure) located at the rear are routed via long cables 202 from the rear part 114 of the server system 100 along the side channel 204 of the server chassis 106, such that the cables 202 can be accessed at the front side 108 of the server system 100. One of the drawbacks is that the length of the cables 202 may cause signal integrity issues that require additional retimers (also referred to as signal conditioners) for improving signal integrity and enhancing system performance and reliability across long cables, thereby increasing the cost of the server system 100.

Figure 3:
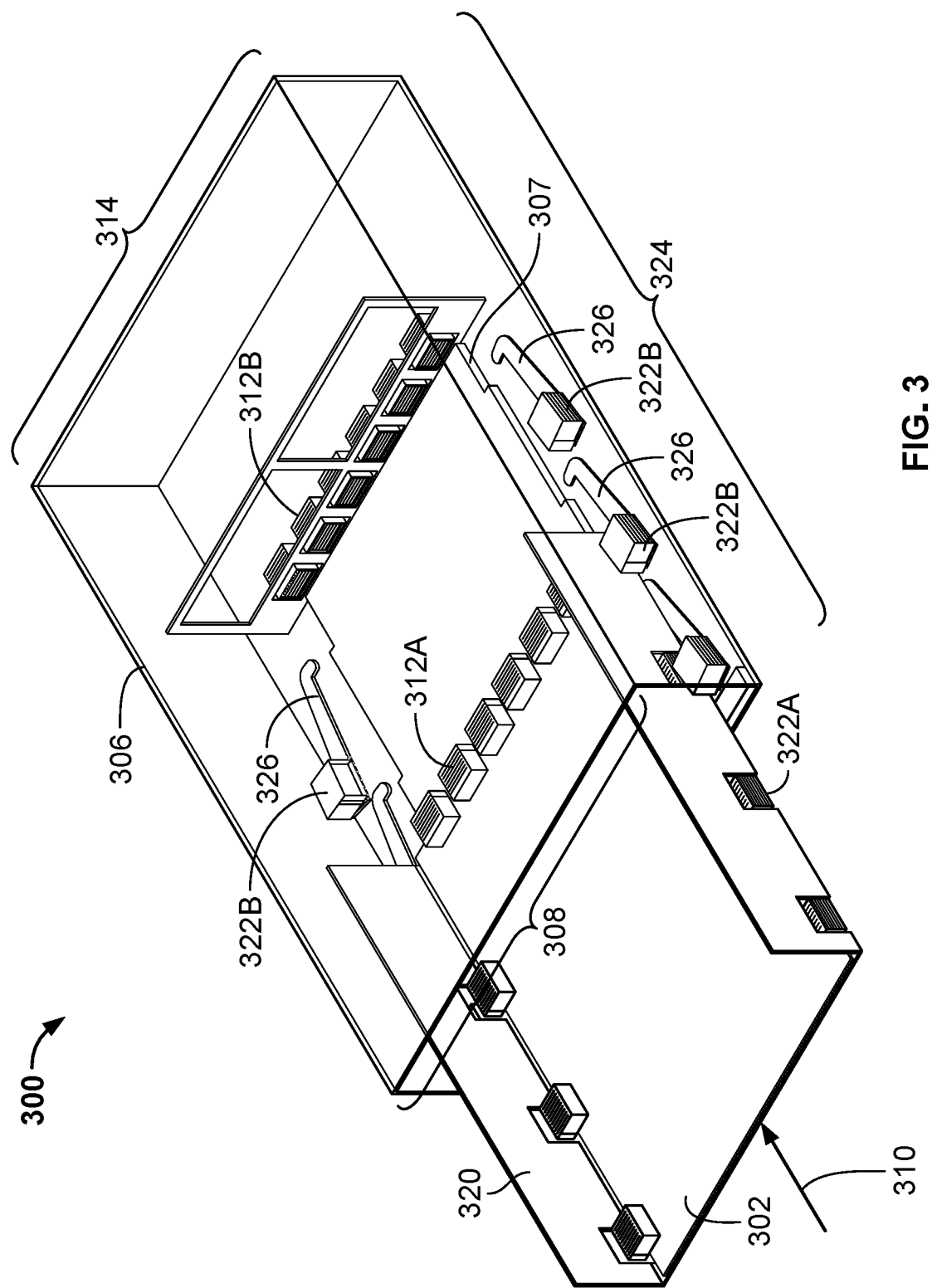
FIG. 3 illustrates an isometric view of an example of a server system 300 that includes electrical connectors located at the lateral side(s) of a chassis for electrically connecting an insertable, removable, or movable component of the server system to other components of the server system.
Figure 4:
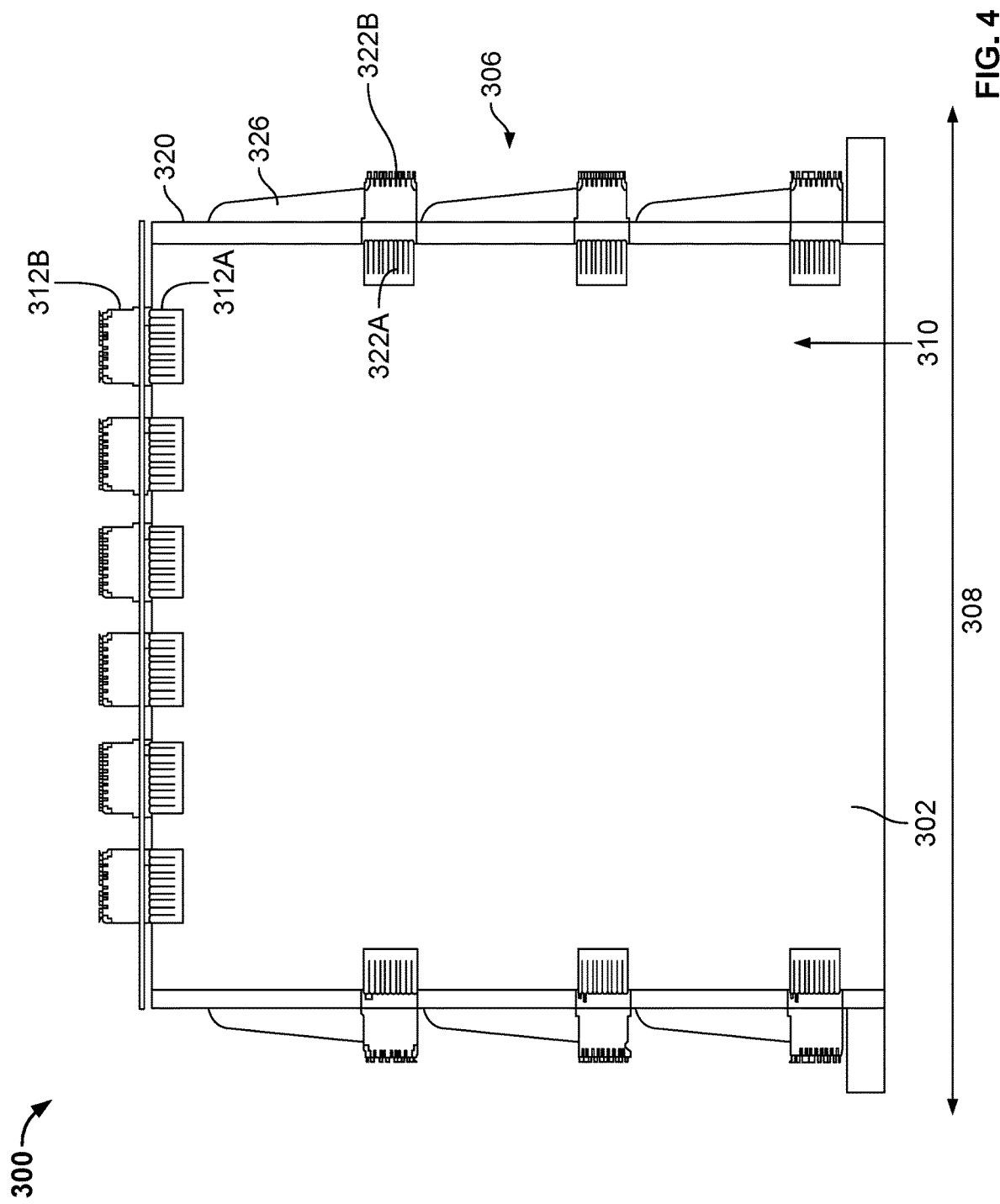
FIG. 4 illustrates a top view of an example of a server system 300 that includes electrical connectors located at the lateral side(s) of a chassis for electrically connecting an insertable, removable, or movable component of the server system to other components of the server system.

FIG. 3 illustrates an isometric view of an example of a server system 300 that includes electrical connectors located at the lateral side(s) of a chassis for electrically connecting an insertable, removable, or movable component of the server system to other components of the server system. FIG. 4 illustrates a top view of an example of a server system 300 that includes electrical connectors located at the lateral side(s) of a chassis for electrically connecting an insertable, removable, or movable component of the server system to other components of the server system.

In some embodiments, server system 300 is a serviceable front-loading server system. Server system 300 includes a server chassis 306 configured to receive one or more insertable, removable, or movable components. Server chassis 306 includes a chassis base 307. In some embodiments, the one or more insertable, removable, or movable components may be a printed circuit board 302. In some embodiments, the printed circuit board 302 is housed in a tray or drawer 320 that can slide in and out of the server chassis 306. The one or more insertable, removable, or movable components (only one is shown in FIG. 3 and FIG. 4) may be installed in the server chassis 306 from the front side 308 of the server system 300. For example, when a movable printed circuit board 302 is installed in the front-loading server system 300, the printed circuit board 302 is pushed in an installing direction 310 into server chassis 306 and is connected to other parts of the server system 300 (e.g., other PCBs of the system) using electrical connectors (322A and 322B) with their two portions (the male pins portion and the female receptacles portion) connected or mated at the lateral sides 324 of system 300. For example, electrical connectors 322A may be the portions of the connectors including the male pins and electrical connectors 322B may be the portions of the connectors including the female receptacles, or vice versa. Electrical connectors 322A are mating halves (or mating portions) of electrical connectors 322B, and vice versa. In some embodiments, the electrical connectors (322A and 322B) are blind mate connectors. Electrical connectors 322A are located along the lateral sides of the one or more insertable, removable, or movable components. For example, electrical connectors 322A are PCB mounted along the lateral sides of the PCBs. Electrical connectors 322B are located along the lateral sides 324 of server chassis 306. Cables may be connected to the electrical connectors 322B.

In some embodiments, server system 300 includes additional electrical connectors located along the rear side 314 of server chassis 306. When the printed circuit board 302 is pushed into server chassis 306, PCB 302 is further connected to other parts of the server system 300 (e.g., other PCBs of the system) using electrical connectors (312A and 312B) with their two portions (the male pins portion and the female receptacles portion) connected or mated at the rear side 314 of system 300.

As will be described in greater detail below, each of the electrical connectors 322B is coupled to a rotating lever arm 326 that is housed in server chassis 306, such that when the rotating level arm 326 is caused to rotate by the insertable, removable, or movable component being pushed inwards into server chassis 306, the electrical connector 322B is caused to connect or mate with a corresponding electrical connector 322A.

Figure 5:
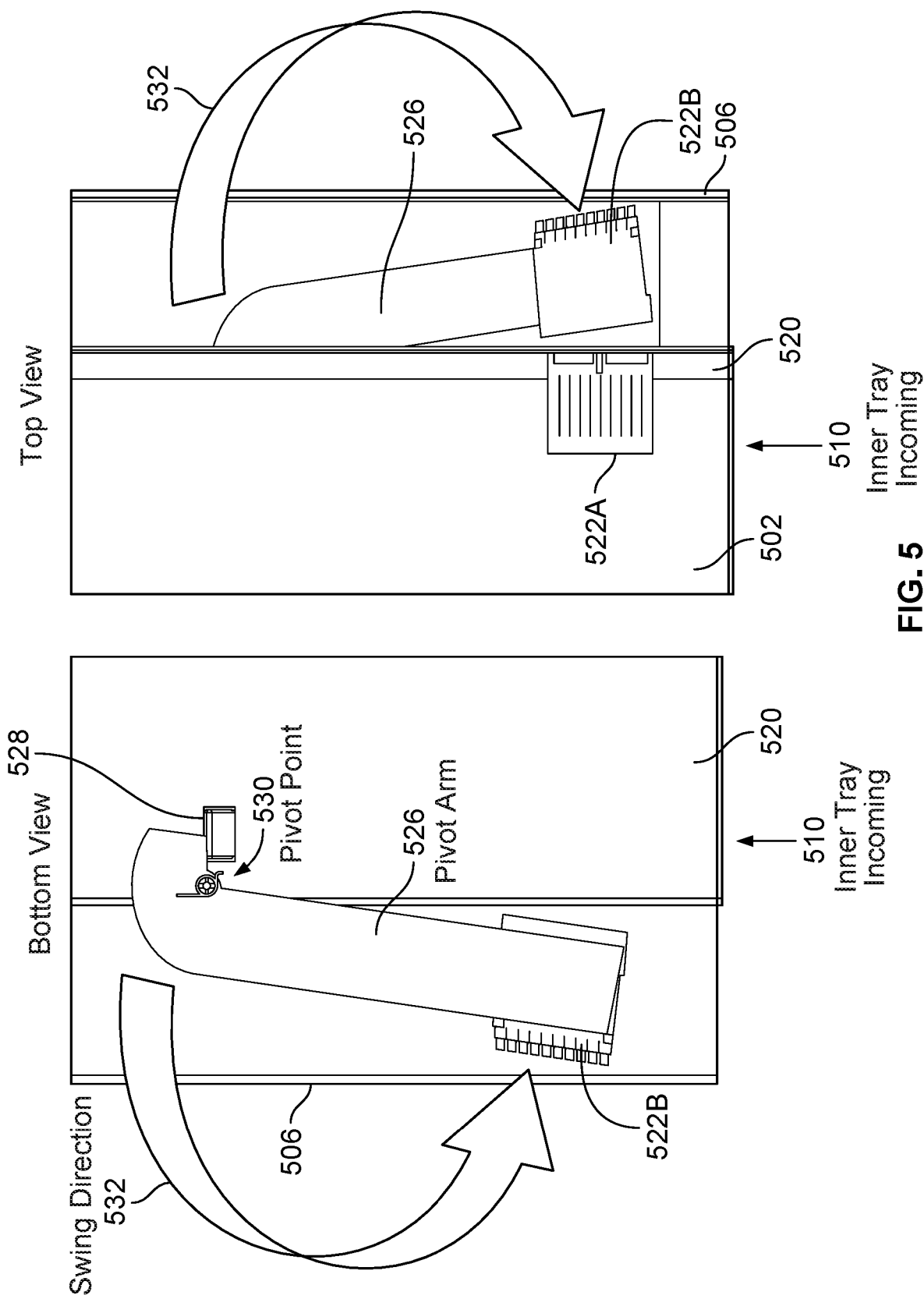
FIG. 5 illustrates an example of an electrical connector coupled to a rotating lever arm such that the electrical connector can be mated with a corresponding electrical connector on a lateral side of a PCB when the rotating lever arm is caused to rotate as the PCB is pushed into the server chassis.

FIG. 5 illustrates an example of an electrical connector coupled to a rotating lever arm such that the electrical connector can be mated with a corresponding electrical connector on a lateral side of a PCB when the rotating lever arm is caused to rotate as the PCB is pushed into the server chassis. The left side of FIG. 5 illustrates a bottom view of the example. The right side of FIG. 5 illustrates a top view of the example.

As shown in the bottom view of FIG. 5, a rotatable lever arm 526 is housed within and is part of the server chassis 506. The rotatable lever arm 526 is configured to pivot about a pivot point or hinge 530 when a force is applied on the lever arm 526 by a contact portion 528 of the movable component that is being inserted in a direction 510 into the chassis 506. In some embodiments, the pivot point 530 includes a torsional spring. In some embodiments, the contact portion is a latch 528 on a tray 520 housing a PCB 502, wherein the tray 520 can slide in and out of the server chassis 506. When tray 520 is pushed inside the server chassis 506, the latch 528 hits the rotatable lever arm 526, and the lever arm 526 pivots about the pivot point 530 and rotates in a swing direction 532. As shown in the top view on FIG. 5, as the lever arm 526 rotates in the swing direction 532, the electrical connector 522B coupled to the lever arm 526 is caused to mate and connect with the electrical connector 522A that is on a lateral side of a PCB 502.

Figure 6A:
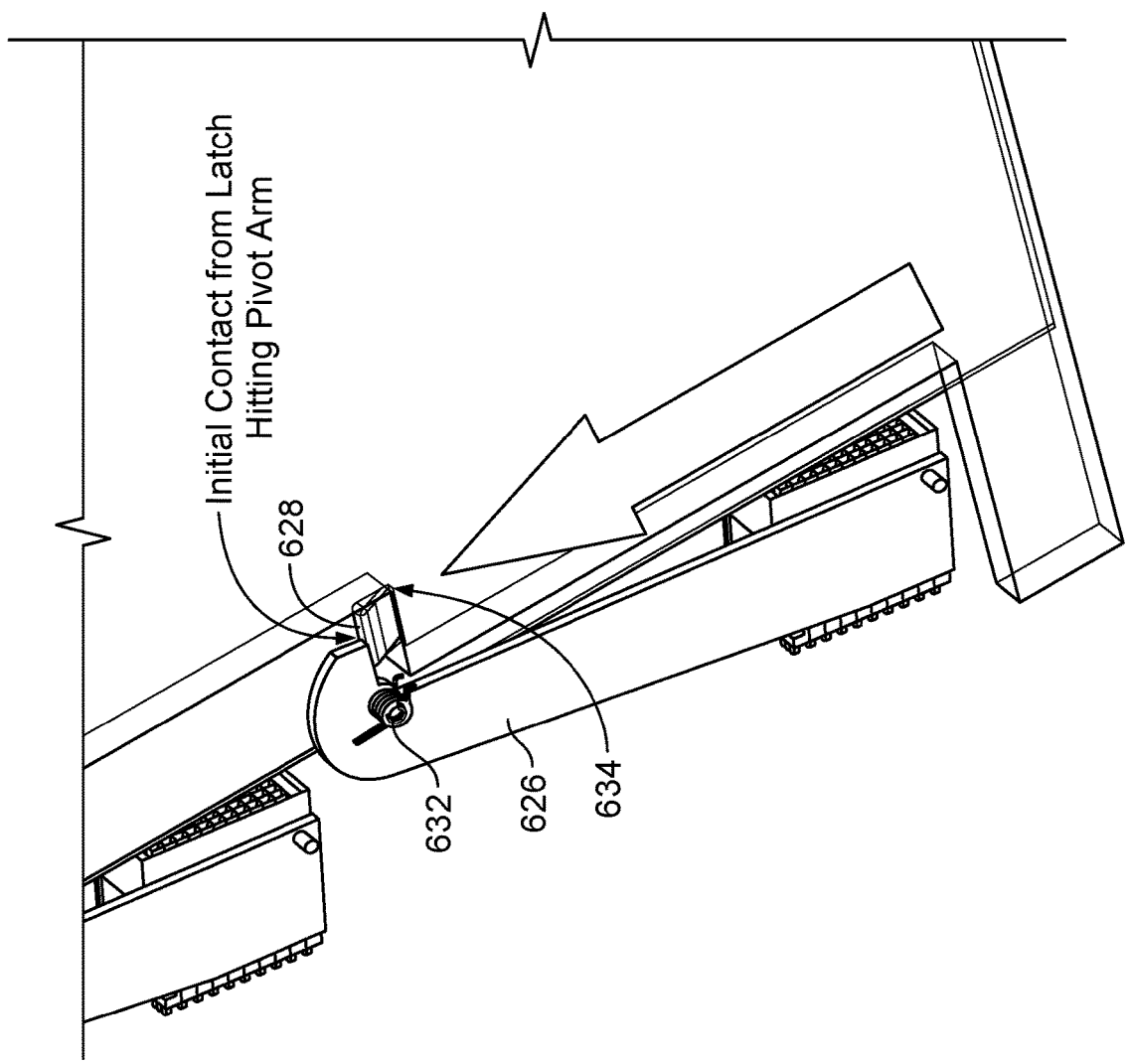
FIG. 6A illustrates one view of a spring-loaded latch for engaging the rotatable lever arm.
Figure 6B:
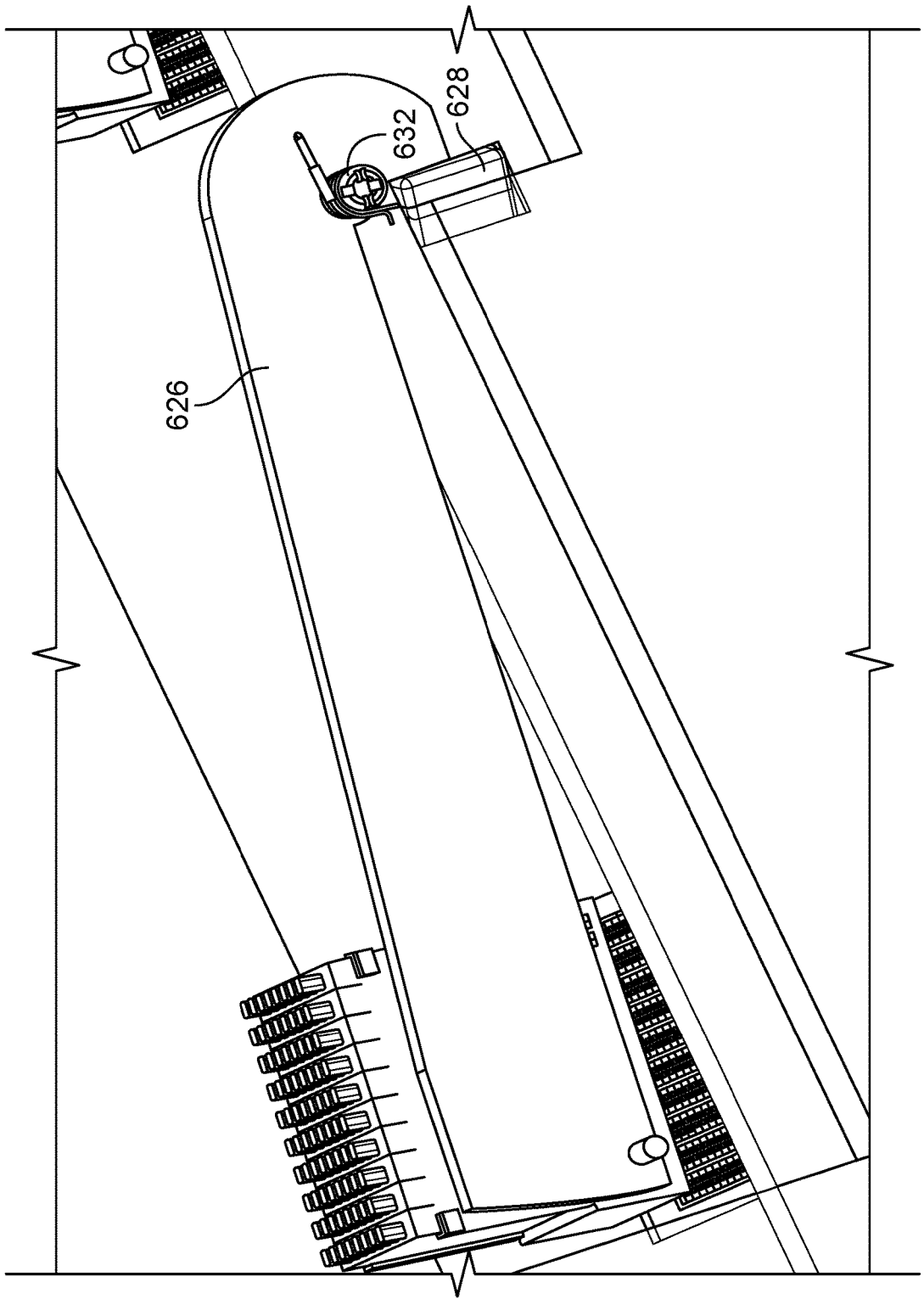
FIG. 6B illustrates a second view of a spring-loaded latch for engaging the rotatable lever arm.

FIG. 6A illustrates one view of a spring-loaded latch for engaging the rotatable lever arm. FIG. 6B illustrates a second view of a spring-loaded latch for engaging the rotatable lever arm. As shown in FIG. 6A and FIG. 6B, a latch 628 is located at the bottom surface of a tray housing a PCB. The latch 628 is loaded with a spring (not shown). For example, the latch 628 may be loaded with a compression spring. When the tray is inserted into the server chassis, the chassis base has an opening or cutout 634 which allows the latch 628 to drop down into the chassis cutout 634 and engage a pivot arm 626 that is attached to the server chassis, causing the arm 626 to swing about a pivot point. Since the latch 628 is loaded with a compression spring, the latch will drop down as soon as there is a cutout 634 of the right size. A cutout is a space or hold left after cutting. The pivot point is loaded with a torsional spring 632.

Figure 7A:
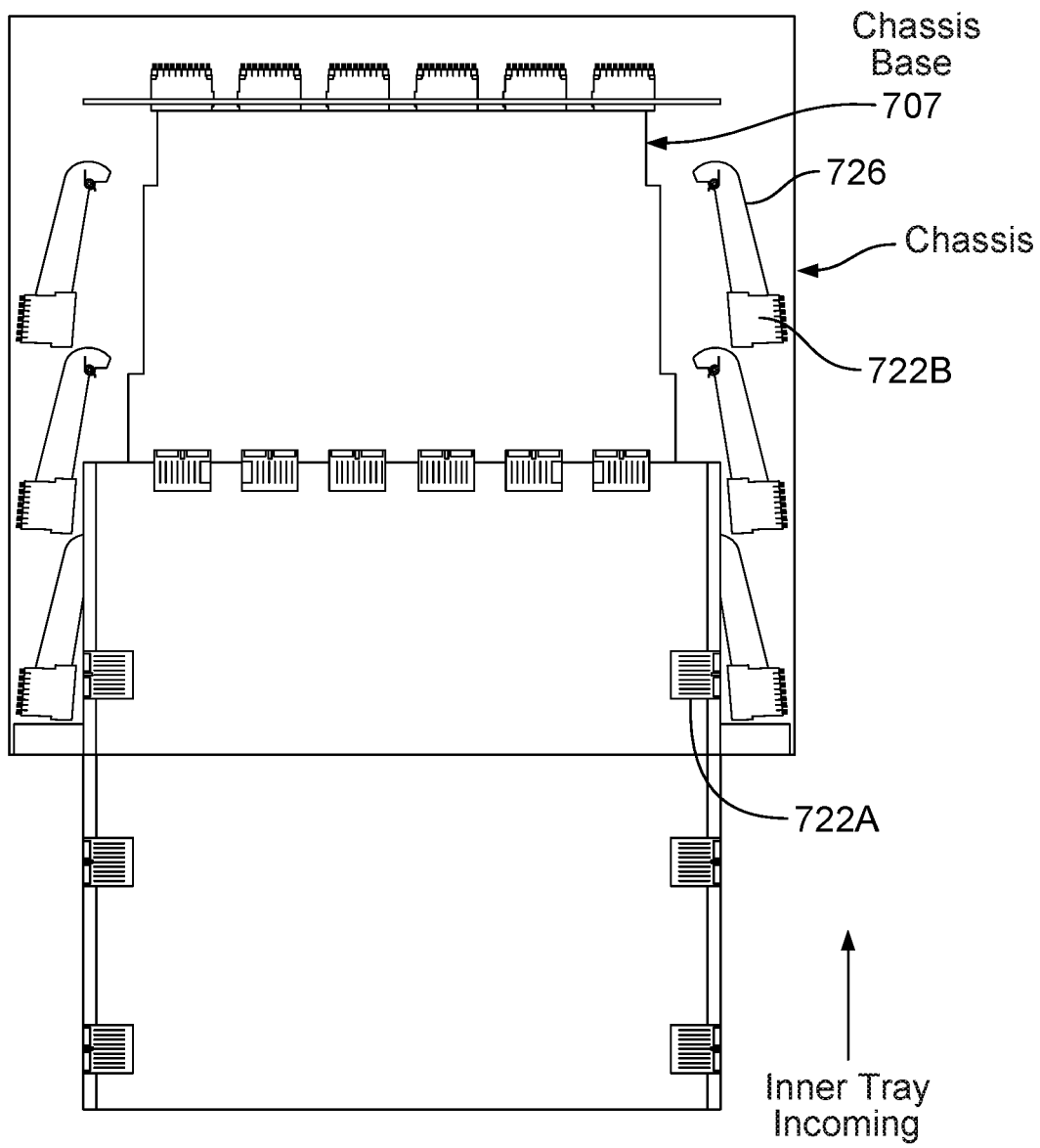
FIG. 7A illustrates a top view of a server system when a tray housing a PCB is being inserted into the system.
Figure 7B:
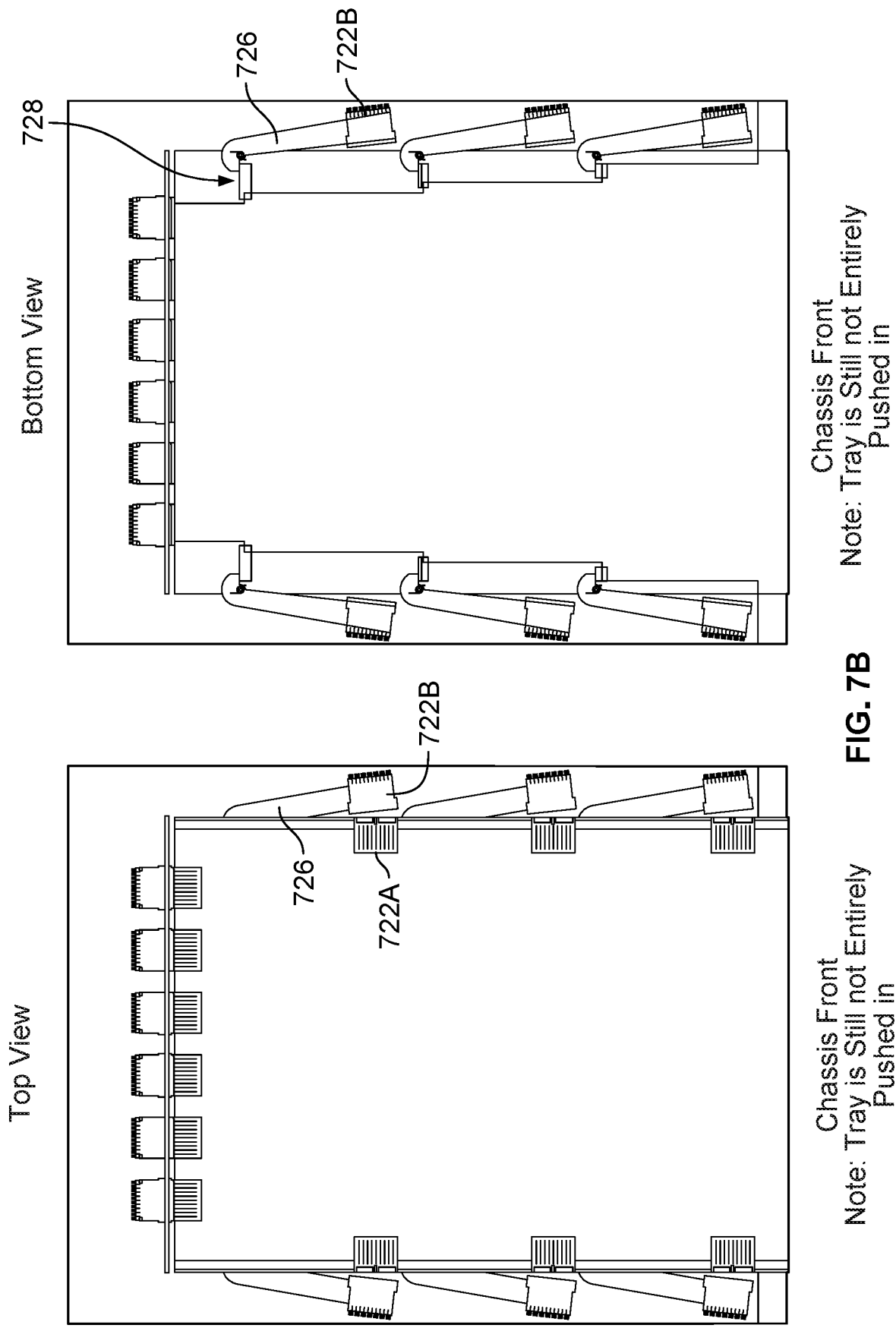
FIG. 7B illustrates a top view and a bottom view of a server system when a spring-loaded latch 728 on the tray hits the pivot arm, causing the arm to swing.
Figure 7E:
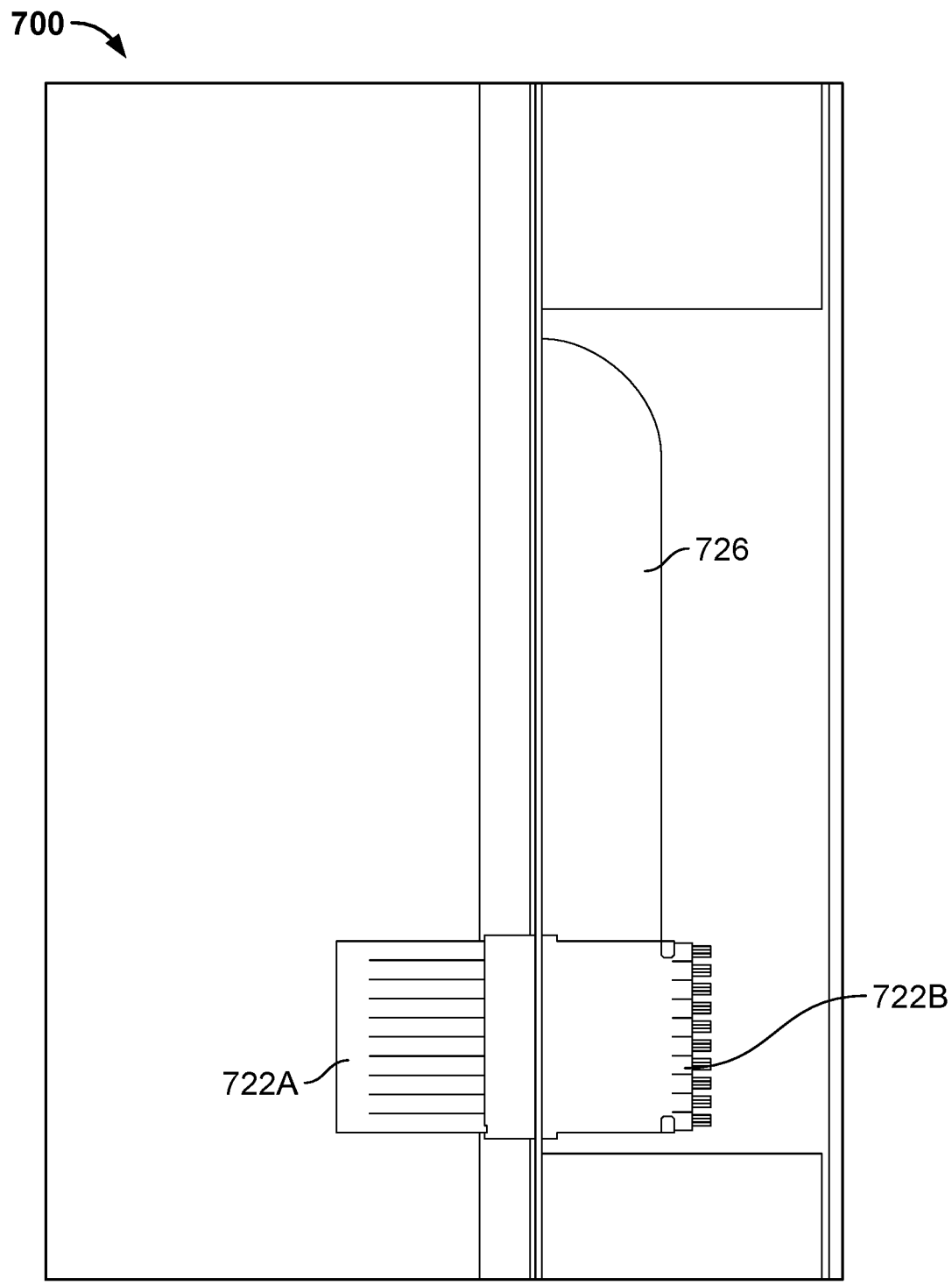
FIG. 7E illustrates an expanded top view of the two portions (the male pins portion and the female receptacles portion) of an electrical connector (722A and 722B) being connected or mated at the lateral side of system 700.

FIG. 7A through FIG. 7E each illustrates a different stage of installing a PCB into the server system. FIG. 7A illustrates a top view of a server system when a tray housing a PCB is being inserted into the system. FIG. 7B illustrates a top view and a bottom view of a server system when a spring-loaded latch 728 on the tray hits the pivot arm 726, causing the arm to swing. FIG. 7C illustrates that when the lever arm 726 is not fully rotated, the two portions (the male pins portion and the female receptacles portion) of an electrical connector (722A and 722B) are not connected or mated at the lateral side of system 700. FIG. 7D illustrates that when the lever arm 726 is fully rotated, the two portions (the male pins portion and the female receptacles portion) of an electrical connector (722A and 722B) are connected or mated at the lateral side of system 700. FIG. 7E illustrates an expanded top view of the two portions (the male pins portion and the female receptacles portion) of an electrical connector (722A and 722B) being connected or mated at the lateral side of system 700.

Figure 8:
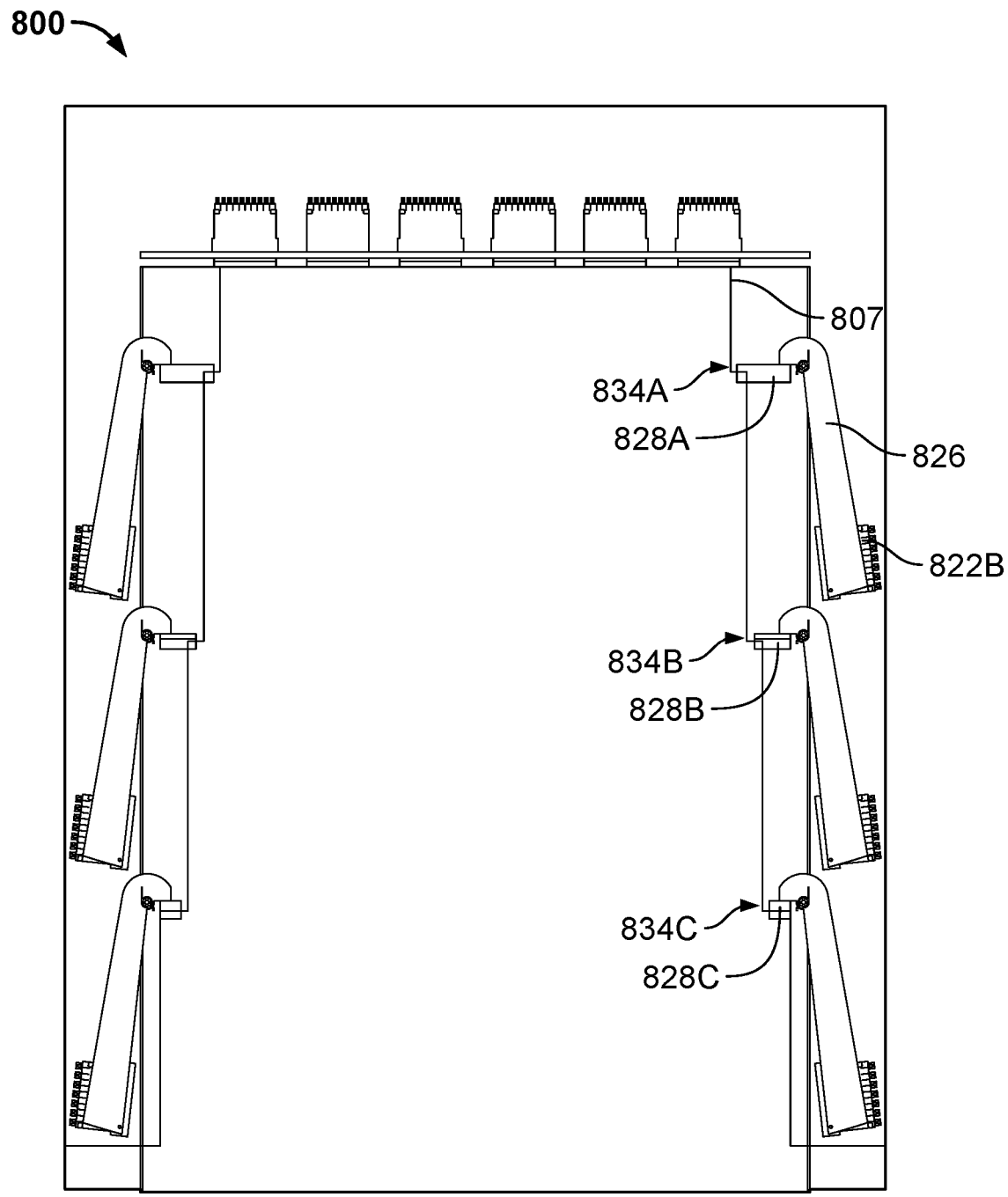
FIG. 8 illustrates one embodiment of the server system that uses latches (828A, 828B, and 828C) with different sizes such that the onset of the swinging of the lever arms 826 happens simultaneously.

FIG. 8 illustrates one embodiment of the server system 800 that uses latches (828A, 828B, and 828C) with different sizes such that the onset of the swinging of the lever arms 826 happens simultaneously. As shown in FIG. 8, there are a plurality of electrical connectors on each lateral side of the server system. The chassis base 807 has a "staggered" design such that the latches (828A, 828B, and 828C), each with different widths, will all drop down into position simultaneously. In some embodiments, the chassis base 807 has a L-shaped cutout, notch, or step (834A, 834B, or 834C) for each corresponding matching latch (828A, 828B, or 828C) that allows the latch to drop down in the L-shaped chassis base cutout and engage a corresponding pivot arm 826 that is attached to the server chassis, causing the arm 826 to swing. Because each of the latches has a different size, each latch can only drop into position in one place. The chassis base has a matching cutout in each designated location. The locations of the L-shaped cutouts and the widths of the latches are selected such that all the latches will drop into position simultaneously.

In some embodiments, the width of the server chassis is wider than the width of the PCB or the tray housing the PCB, such that the additional width can provide a space for the lever arm to rotate about the pivot point. In addition, the height of the server chassis is higher than the height of the PCB(s) or the tray(s) housing the PCB(s), such that the additional height can provide a space for a lever arm to actuate beneath the PCB or the tray.

In some embodiments, the lateral electrical connectors are blind mate connectors. A blind mate connector has a mating action that happens via a sliding or snapping action, which can be accomplished without a tool, such as a wrench. A blind mate connector has self-aligning features that allow for small misalignments when mating.

In some embodiments, lateral electrical connectors with a longer wipe are selected to facilitate the mating of the mating halves of the lateral electrical connector. The wipe of a connector is the distance within which electrical contact of the mated halves is good. The wipe of a connector is the distance within which there is solid electrical contact within the connector. Connectors with a very short wipe (e.g., distance for solid electrical contact is less than 1 mm) may not be suitable.

In some embodiments, the lateral electrical connectors are floating connectors. A floating connector is deliberately designed to move slightly to accommodate the misalignment of its mating half or mating portion. The lateral electrical connectors are chosen such that they have enough of internal float, i.e., the internal contacts can accommodate some movement relative to the external shell. The amount of float that is built into the housing of the lateral electrical connector is selected based on the approach angle of the lever arm.

Figure 9:
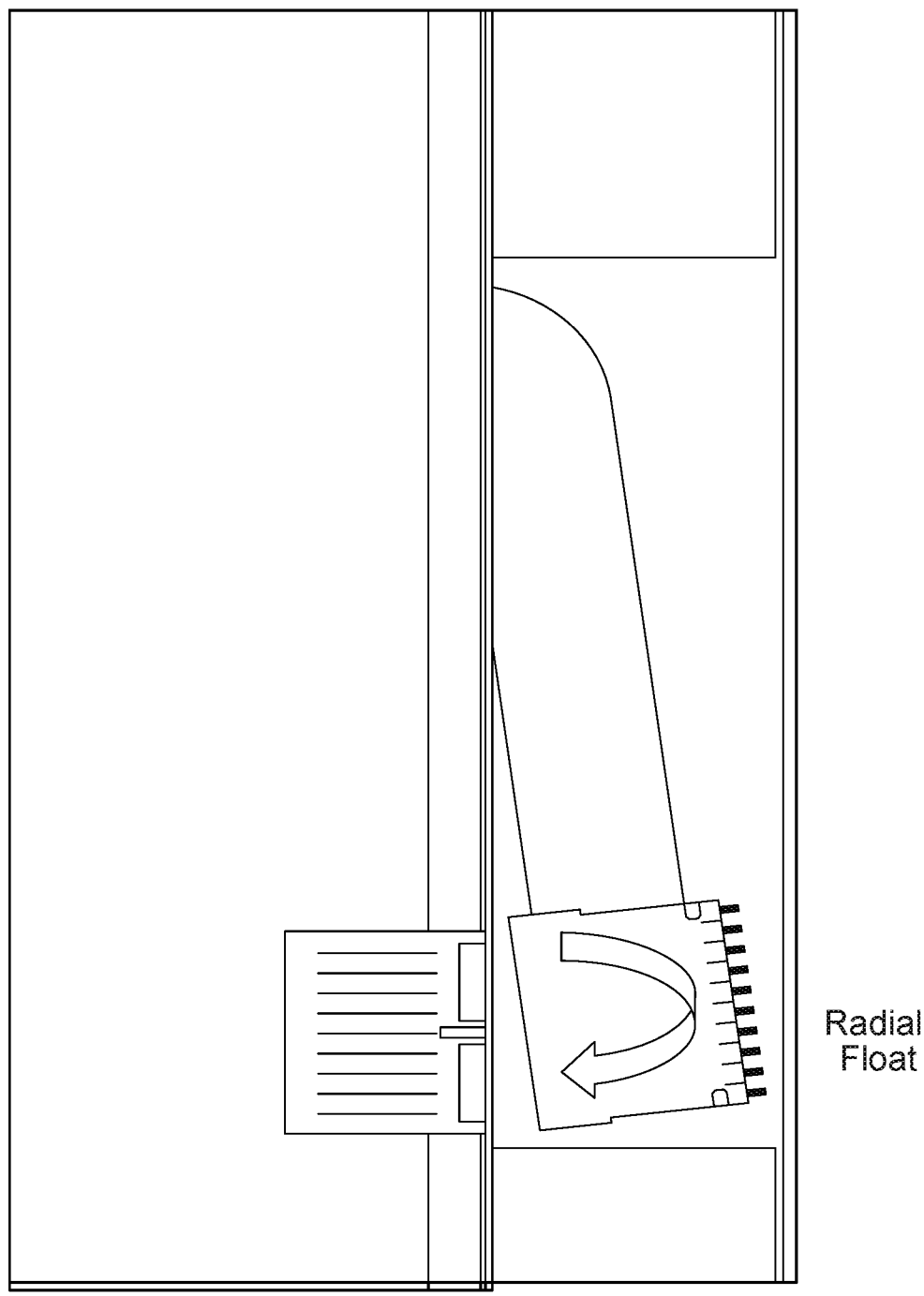
FIG. 9 illustrates that a connector may be loosely attached to the pivot arm in such a way to allow for radial float.

In some embodiments, float may be built into the chassis design. The pivot arm may be designed with sufficient float to accommodate the misalignment of the mating halves of the electrical connectors. The pivot point is designed to move slightly to accommodate the misalignment of the mating halves of the electrical connectors. FIG. 9 illustrates that a connector may be loosely attached to the pivot arm in such a way to allow for radial float. With radial float, the connector attached to the pivot arm may rotate relative to the pivot arm, allowing a straight approach of the connector attached to the pivot arm to its mating half connector.

Figure 10:
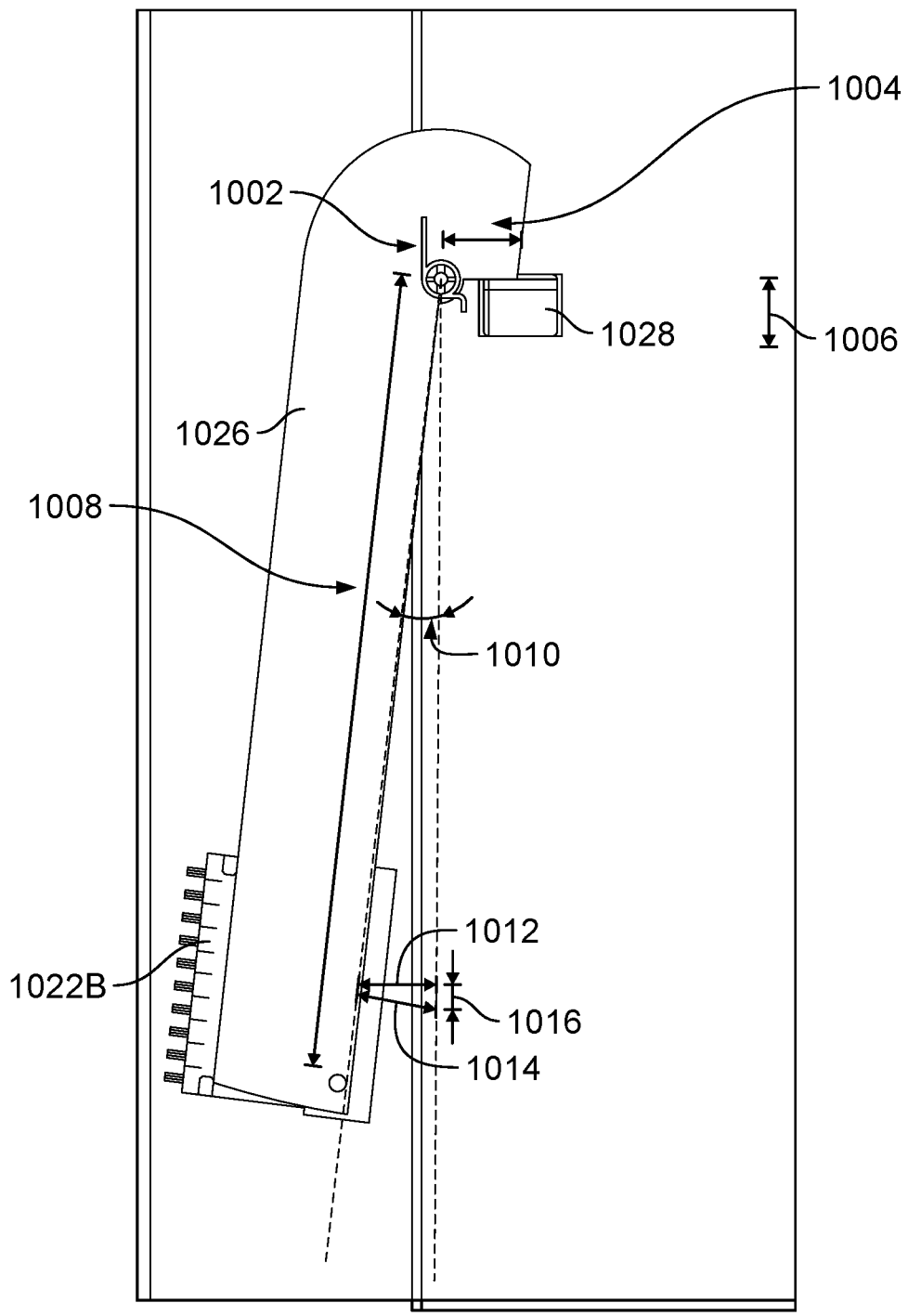
FIG. 10 illustrates one example of calculating the amount of float based on some of the components of a server system with a lateral electrical connector.

FIG. 10 illustrates one example of calculating the amount of float based on some of the components of a server system with a lateral electrical connector. As shown in FIG. 10, pivot point 1002 is the center about which the pivot arm 1026 rotates. Arm length 1004 is the distance from the pivot point 1002 to the chassis contact point, i.e., the latch 1028. Chassis travel 1006 is the distance between the initial contact of the latch 1028 and full mate. Arm length 1008 is the distance from the pivot point 1002 to the connector's center. Angle 1010 is the swing angle of the pivot arm 1026 from initial engagement to full mate. Connector travel 1012 is the distance that the connector 1022B moves in order to make the full mate. Arm travel 1014 is the distance the connector 1022B would travel if it were to move in a normal (90 degrees) direction from its initial position. Connector float 1016 is the offset in distance had the connector 1022B been approaching in a normal (90 degrees) direction; it is also the amount of float the connector 1022B has in order to mate.

A latch may be loaded with a compression spring. A pivot point includes a torsional spring. These springs are selected based on a number of factors; for example, these springs may be selected based on the electrical connector characteristics, including the mate and unmate force per pin and the number of pins. These springs may also be selected based on the pivot arm design.

In some embodiments, the quantity of lateral connectors on each lateral side of the server system is dependent on multiple factors, including the PCB depth, connector specifications, and the like.

Server systems that include lateral connectors have many advantages. As the number of connectors to provide all the necessary pins for the connections increases, additional connectors may be placed on both sides of the PCB. The length of the lateral sides of the PCB is less limited since the PCB can be made deeper: this is because server racks are typically more restricted in their width than in their depth. Another advantage is that the unmating of the lateral connectors may be simply accomplished by pulling the PCB out of the server chassis, which is the reversal of the mating action; there are no additional locking/unlocking features required. In other words, the user faces no additional steps compared to using traditional blind mate connectors, thereby keeping serviceability simple and easy. Another advantage is that the airflow of the server system is improved because the connectors are in line with the airflow direction instead of blocking air across the entire width of the PCB as in the traditional approach. Another advantage is that the cable lengths out of the front of the chassis may be reduced, improving signal integrity and reducing cost, because neither longer cable lengths nor additional retimers are needed.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a chassis configured to receive a movable component inserted in the chassis, wherein the movable component comprises a tray housing a printed circuit board, and wherein the tray is configured to slide in and out of the chassis;
   a lever arm housed at least in part within the chassis and configured to rotate about a pivot point from a force applied on the lever arm by a contact portion of the movable component inserted in the chassis; and
   at least a portion of an electrical connector coupled to the lever arm and configured to rotate and mate with a mating portion located on a lateral side of the moveable component.

2. The system of claim 1, wherein the movable component comprises a printed circuit board.

3. The system of claim 1, wherein the movable component is configured to be inserted from a front side of the chassis.

4. The system of claim 1, wherein the electrical connector comprises a blind mate connector, wherein the blind mate connector comprises a first portion including male pins and a second portion including female receptacles.

5. The system of claim 4, wherein the blind mate connector comprises a floating connector having an internal float, wherein the internal float is selected based on an approach angle of the lever arm.

6. The system of claim 1, wherein the at least a portion of the electrical connector is loosely attached to the lever arm to allow the at least a portion of the electrical connector to rotate relative to the lever arm.

7. The system of claim 1, further comprising at least a portion of a second electrical connector located on a rear side of the chassis and is configured to mate with a mating portion located on a rear side of the moveable component.

8. The system of claim 1, wherein the contact portion of the movable component comprises a latch, and wherein the latch applies the force on the lever arm in response to the latch making contact with the lever arm.

9. The system of claim 8, wherein the latch is spring-loaded and located at a bottom surface of the moveable component.

10. The system of claim 8, wherein the latch is spring-loaded with a compression spring.

11. The system of claim 8, wherein the chassis further comprises a chassis base, wherein the chassis base includes a cutout that allows the latch to drop down into the cutout and make contact with the lever arm.

12. The system of claim 11, wherein the cutout comprises a L-shaped cutout that matches the latch.

13. The system of claim 11, wherein the chassis includes a second cutout that allows a second latch to drop down into the second cutout and make contact with a second lever arm.

14. The system of claim 13, wherein the cutout and the second cutout have different widths such that the cutout matches with the latch and the second cutout matches with the second latch.

15. The system of claim 13, wherein the cutout and the second cutout have different widths such that the latch drops down into the cutout and the second latch drops down into the second cutout substantially simultaneously, allowing the latch and the second latch to make contact with the lever arm and the second lever arm, respectively, substantially simultaneously.

16. A method, comprising:
   providing a chassis configured to receive a movable component inserted in the chassis, wherein the movable component comprises a tray housing a printed circuit board, and wherein the tray is configured to slide in and out of the chassis;
   providing a lever arm housed at least in part within the chassis and configured to rotate about a pivot point from a force applied on the lever arm by a contact portion of the movable component inserted in the chassis; and
   providing a least a portion of an electrical connector coupled to the lever arm and configured to rotate and mate with a mating portion located on a lateral side of the moveable component.

17. The method of claim 16, wherein the contact portion of the movable component comprises a latch, and wherein the latch applies the force on the lever arm in response to the latch making contact with the lever arm.

18. The method of claim 17, wherein the latch is spring-loaded and located at a bottom surface of the moveable component.

19. The method of claim 17, wherein the latch is spring-loaded with a compression spring.

20. The method of claim 17, wherein the chassis further comprises a chassis base, wherein the chassis base includes a cutout that allows the latch to drop down into the cutout and make contact with the lever arm.

21. A system, comprising:
   a chassis configured to receive a movable component inserted in the chassis;
   a lever arm housed at least in part within the chassis and configured to rotate about a pivot point from a force applied on the lever arm by a contact portion of the movable component inserted in the chassis;
   at least a portion of an electrical connector coupled to the lever arm and configured to rotate and mate with a mating portion located on a lateral side of the moveable component; and
   at least a portion of a second electrical connector located on a rear side of the chassis and is configured to mate with a mating portion located on a rear side of the moveable component.

22. A system, comprising:
   a chassis configured to receive a movable component inserted in the chassis;
   a lever arm housed at least in part within the chassis and configured to rotate about a pivot point from a force applied on the lever arm by a contact portion of the movable component inserted in the chassis, wherein the contact portion of the movable component comprises a latch, and wherein the latch applies the force on the lever arm in response to the latch making contact with the lever arm, wherein the latch is spring-loaded and located at a bottom surface of the moveable component; and at least a portion of an electrical connector coupled to the lever arm and configured to rotate and mate with a mating portion located on a lateral side of the moveable component.

23. A system, comprising:
a chassis configured to receive a movable component inserted in the chassis;
a lever arm housed at least in part within the chassis and configured to rotate about a pivot point from a force applied on the lever arm by a contact portion of the movable component inserted in the chassis, wherein the contact portion of the movable component comprises a latch, and wherein the latch applies the force on the lever arm in response to the latch making contact with the lever arm, wherein the latch is spring-loaded with a compression spring; and
at least a portion of an electrical connector coupled to the lever arm and configured to rotate and mate with a mating portion located on a lateral side of the moveable component.

24. A system, comprising:
a chassis configured to receive a movable component inserted in the chassis;
a lever arm housed at least in part within the chassis and configured to rotate about a pivot point from a force applied on the lever arm by a contact portion of the movable component inserted in the chassis, wherein the contact portion of the movable component comprises a latch, and wherein the latch applies the force on the lever arm in response to the latch making contact with the lever arm, wherein the chassis further comprises a chassis base, wherein the chassis base includes a cutout that allows the latch to drop down into the cutout and make contact with the lever arm; and
at least a portion of an electrical connector coupled to the lever arm and configured to rotate and mate with a mating portion located on a lateral side of the moveable component.

* * * * *